(12) United States Patent
Johns et al.

(10) Patent No.: US 6,651,038 B1
(45) Date of Patent: Nov. 18, 2003

(54) ARCHITECTURE FOR SIMULATION TESTBENCH CONTROL

(75) Inventors: Clifford Royal Johns, Wheaton, IL (US); David George Mihal, Oswego, IL (US); David Anthony Pierce, Wheaton, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/342,380

(22) Filed: Jun. 29, 1999

(51) Int. Cl.[7] .............................................. G06F 17/50
(52) U.S. Cl. .......................................... 703/27; 703/14
(58) Field of Search .............................. 703/27, 14, 20; 714/739; 700/81, 82, 276, 67; 702/116, 91

(56) References Cited

U.S. PATENT DOCUMENTS

| | | | | |
|---|---|---|---|---|
| 4,947,355 A | * | 8/1990 | Koeman | ................ 364/571.01 |
| 5,805,776 A | * | 9/1998 | Juengst et al. | ................. 395/75 |
| 5,870,308 A | * | 2/1999 | Dangelo et al. | ............ 364/489 |
| 6,182,258 B1 | * | 1/2001 | Hollander | ................... 714/739 |
| 6,347,388 B1 | * | 2/2002 | Hollander | ................... 714/739 |

* cited by examiner

Primary Examiner—Samuel Broda
Assistant Examiner—T. Phan

(57) ABSTRACT

The present invention is directed to a simulation testbench 10 which includes a circuit under test 14 and a plurality of test models 12 designated 1 through N. The test models 12 include at least one of a driver and a monitor. The drivers selectively apply stimuli to the circuit under test 14, and the monitors observe responses to the stimuli from the circuit under test 14. A single controller 16 is provided for the plurality of test models 12. The controller 16 has an instruction source 18 including a list of commands which control the plurality of test models 12. The commands are routed from the instruction source 18 over a model control bus 24 to the plurality of test models 12. In a preferred embodiment, a common bus interface 28 links each test model 12 to the model control bus 24, and a sequencer 26 addresses the instruction source 18 to put successive commands out on the model control bus 24 where they are accessed via the common bus interfaces 28 associated with the test models 12 for which the commands are intended.

9 Claims, 5 Drawing Sheets

ARCHITECTURE FOR SIMULATION TESTBENCH CONTROL

BACKGROUND OF THE INVENTION

The present invention relates to the art of electronic circuit design. It finds particular application in conjunction with testing and/or monitoring of simulated circuits in a simulated testbench environment, and will be described with particular reference thereto. However, it is to be appreciated that the present invention is also amenable to other like applications.

In the field of electronic circuit design, it is typically advantageous to determine the manner in which a proposed circuit will respond to a given set of inputs or stimuli without having to endure the often costly and/or time consuming process of manufacturing physical prototypes for each proposed circuit design. Toward this end, software simulations have been developed that emulate a circuit under test (CUT) and test models. The test models include both drivers which apply stimuli to the CUT, and monitors which observe and/or analyze the CUT's response to the stimuli. Collectively, the CUT and test models make up a simulation testbench. Commonly, VHSIC Hardware Description Language (VHDL) is used to construct the simulation testbench (Note: VHSIC stands for Very High Speed Integrated Circuit). VHDL is an industry standard adopted in 1987 by IEEE for system modeling, documentation, simulation, and synthesis of digital and analog systems.

Previously, users were required to specifically code any interaction between test models and had to modify the connectivity of the circuit to coordinate stimuli. For example, with reference to FIG. 1, a prior art simulation testbench generally designated by reference numeral 10' includes multiple test models 12' which stimulate, monitor, and/or otherwise interact with a CUT 14'. A user 16' separately and individually controlled each test model 12'. A link 12a' was required to tie signals from the test models 12' together so that they could communicate with each other, e.g., to coordinate their operations. This made synchronization difficult. To change the signal controlled interaction between the test models 12' required recompiling the code and, possibly, recompiling the circuit connectivity if new elements of interaction were to be included.

Additionally, much of the test model interaction was done using specific timing in the simulation. For example, at simulation time=100,000 ns the user would force a signal high which would reset two of the test models 12' so a particular part of the simulation would take place. Then at some time later, e.g., 110,000 ns, when certain results were expected, one of the test models 12' would be instructed to perform some operation such as a read operation. However, if the other test model 12' were later altered to perhaps include some operation prior to simulation time=110,000 ns then the synchronization is thrown off. Correction then requires re-coding of both test models.

Alternately, with reference to FIG. 2, a prior art simulation testbench 10" for testing a CUT 14" would employ a single monolithic test model 12" which incorporated all the models being used. The user 16" would then exercise control over the single test model 12". A major limitation in this case is that for simulations employing many test models the code required for the monolithic test model 12" become prohibitively large and unwieldy. Additionally, the lack of modularity limits the usefulness of the test model 12" in so much as, without extensive re-coding, it is only suited to running the simulation for which it was designed.

Accordingly, the present invention contemplates a new and improved architecture and/or technique for simulation testbench control which overcomes the above-referenced problems and others.

SUMMARY OF THE INVENTION

In accordance with one aspect of the present invention, a simulation testbench is provided. It includes a circuit under test and a plurality of test models. The test models include at least one of a driver and a monitor. Drivers selectively apply stimuli to the circuit under test, and monitors observe responses to the stimuli from the circuit under test. A single controller is provided for the plurality of test models. The controller has an instruction source including a list of commands which control the plurality of test models. The commands are routed from the instruction source over a model control bus to the plurality of test models.

In accordance with a more limited aspect of the present invention, the controller receives responses from the plurality of test models via the model control bus.

In accordance with a more limited aspect of the present invention, a common bus interface is associated with each of the plurality of test models. The common bus interface links its associated test model to the model control bus.

In accordance with a more limited aspect of the present invention, the common bus interface accepts commands addressed to its associated test model off of the model control bus, and returns to the controller, via the model control bus, responses to the commands.

In accordance with a more limited aspect of the present invention, the common bus interface includes a test model control which: (i) signals the test model to begin an operation in accordance with the command accepted, and (ii) receives signals indicative of the test model completing the operation.

In accordance with a more limited aspect of the present invention, a sequencer addresses one command at a time from the list such that it is put out on the model control bus.

In accordance with a more limited aspect of the present invention, each command includes an operator designating an operation to be performed and a call address corresponding to a unique model address assigned to each test model. The call address designates the test model to which the command is to be routed.

In accordance with a more limited aspect of the present invention, each command further includes at least one data field which stores data employed in the operation.

In accordance with a more limited aspect of the present invention, the model control bus includes separate channels for at least the operator, the data field, and the call address.

In accordance with a more limited aspect of the present invention, the model control bus further includes separate return channels for routing responses from the plurality of test models to the controller.

In accordance with a more limited aspect of the present invention, the sequencer has a presence on the model control bus.

In accordance with a more limited aspect of the present invention, at least one separate channel on the model control bus links the sequencer with the plurality of test models.

In accordance with another aspect of the present invention, a method of controlling a simulated testbench is provided. The method includes establishing a list of commands which control a plurality of test models. From the list of commands, one is selected and put out on a model control bus where it is routed to the test model for which it is intended. From there, the command is accessed and carried out in the test model to which it was routed such that an interaction with a circuit under test is achieved.

In accordance with a more limited aspect of the present invention, the interaction involves either stimulating the circuit under test or monitoring a response from the circuit under test.

In accordance with a more limited aspect of the present invention, the step of establishing a list of commands includes storing the list of commands in an instruction source.

In accordance with a more limited aspect of the present invention, the step of establishing a list of commands involves interactively entering the commands into a controller.

In accordance with a more limited aspect of the present invention, the method further includes monitoring a response to the interaction from the circuit under test. The monitored response is then put out on the model control bus and accessed from there.

In accordance with a more limited aspect of the present invention, the step of routing commands on the model control bus involves assigning an call address to the command. The call address corresponds to a unique model address assigned to the test model for which the command is intended.

In accordance with a more limited aspect of the present invention, the method further includes, between the steps of accessing the command and carrying out the command, signaling the test model to begin. After carrying out the command, the method also includes signaling that the test model has completed.

In accordance with a more limited aspect of the present invention, the signaling is propagated over the model control bus.

In accordance with a more limited aspect of the present invention, after signaling that the test model has completed carrying out the command, the method is automatically repeated with a next command selected from the list.

In accordance with a more limited aspect of the present invention, prior to the method being automatically repeated, one or more of the plurality of test models are accessed such that the circuit under test does not experience a lapse in simulation time.

One advantage of the present invention is ease in adding and removing test models from the simulation test bench.

Another advantage of the present invention is its single controller allows tight control over stimulus generation and response analysis.

Yet another advantage of the present invention is the ability to access the test models in zero simulation time.

Another advantage of the present invention is portability. That is to say, it is not restricted to a particular simulator or simulation environment. Rather, it uses standard VHDL and event-driven simulator operation to achieve its goals.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
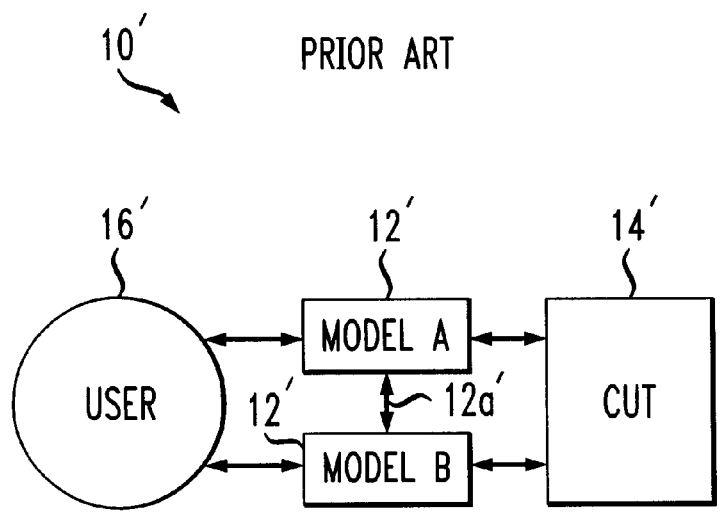
FIG. 1 is a diagrammatic illustration showing the operation of a simulation testbench in accordance with aspects of the prior art.
Figure 2:
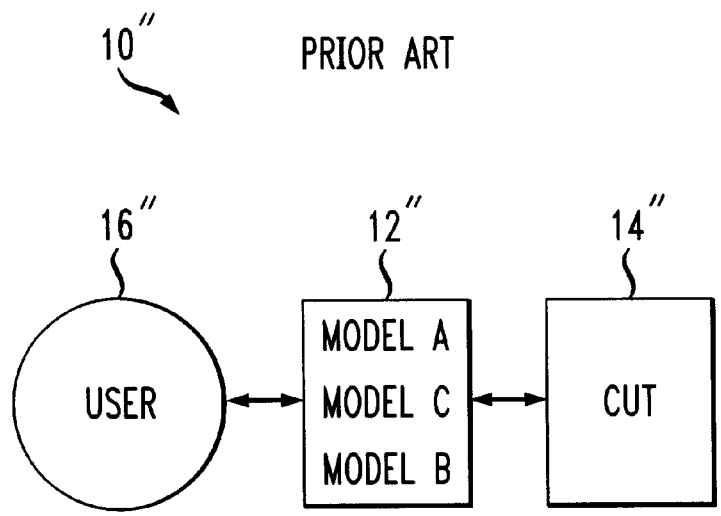
FIG. 2 is a diagrammatic illustration showing the operation of another simulation testbench in accordance with aspects of the prior art.
Figure 3:
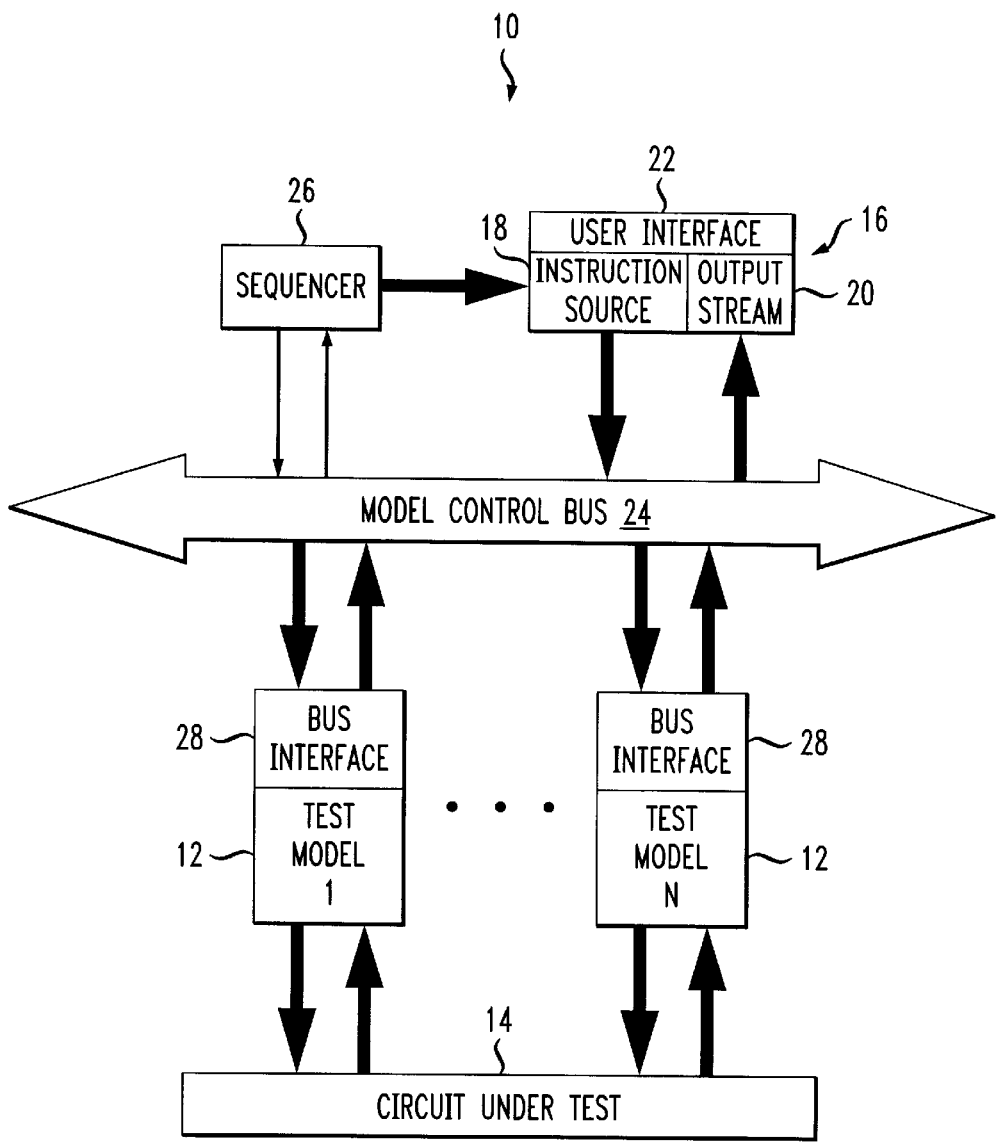
FIG. 3 is a diagrammatic illustration showing the operation of a simulation testbench in accordance with aspects of the present invention.

With reference to FIG. 3, a simulation testbench in accordance with a preferred embodiment of the present invention is generally designated by reference numeral 10. Preferably, the simulation testbench 10 is constructed using VHDL or the like. The simulation testbench 10 includes multiple test models 12 which stimulate, monitor, and/or otherwise interact with a CUT 14. The test models 12, designated 1 through N, are optionally drivers, monitors, or combination thereof. The drivers stimulate or provide input to the CUT 14, and the monitors observe the CUT's responses to the stimuli or input.

A single controller 16 is provided for controlling the simulation testbench 10. In this manner, a user (e.g., a simulation and/or circuit design engineer) exercises control over the entire simulation testbench 10 from a centralized point. The controller 16 includes an instruction source 18, an output stream 20, and a user interface 22.

The instruction source 18 includes a list of commands for the test models 12. In a preferred embodiment, the instruction source 18 obtains the commands from a pre-compiled specialized random access memory (RAM) module which loads the commands on start-up. The RAM module is specialized in the sense that it runs a particular predetermined simulation based on the commands contained therein. The RAM module is created from command scripts via a separate utility. In an alternate embodiment, the instruction source 18 obtains the commands from user input or batch files containing the command scripts.

The output stream 20 conveys the status, results, and other like information from the simulation to the user via a standard output device such as a computer screen, disk drive, printer or like device. Optionally, in the case where the RAM module is employed, the results are automatically dumped to an output file upon completion of the command scripts.

The user interface 22 provides the user with access to the instruction source 18 and output stream 20 via standard input/output devices (e.g., keyboards, mouses, disk drives, computer screens, printers, and the like). optionally, interactive control is achieved through the use of the user interface 22. For example, the simulation may optionally be interrupted and commands inserted into the instruction source 18 via the user interface. Additionally, the output stream 20 may optionally return to the user interface 22 results corresponding to the various commands alongside the same such that a correlation therebetween is readily made.

The controller 16 is linked to all the test models 12 via a model control bus 24 over which data and/or commands are passed or routed between the controller 16 and test models 12. A high level control or sequencer 26 addresses or selects one command at a time from the instruction source 18 such that it is put out on the model control bus 24. The sequencer 26 also has a presence on the model control bus 24.

Each of the 1 through N test models 12 includes a standardized or common bus interface 28 which links the test model 12 to the model control bus 24. The common bus interfaces 28 accept, off of the model control bus 24, commands addressed to or otherwise intended for their corresponding test models 12. Likewise, the common bus interfaces 28 return to the controller, via the model control bus 24, responses to the commands.

Figure 4:
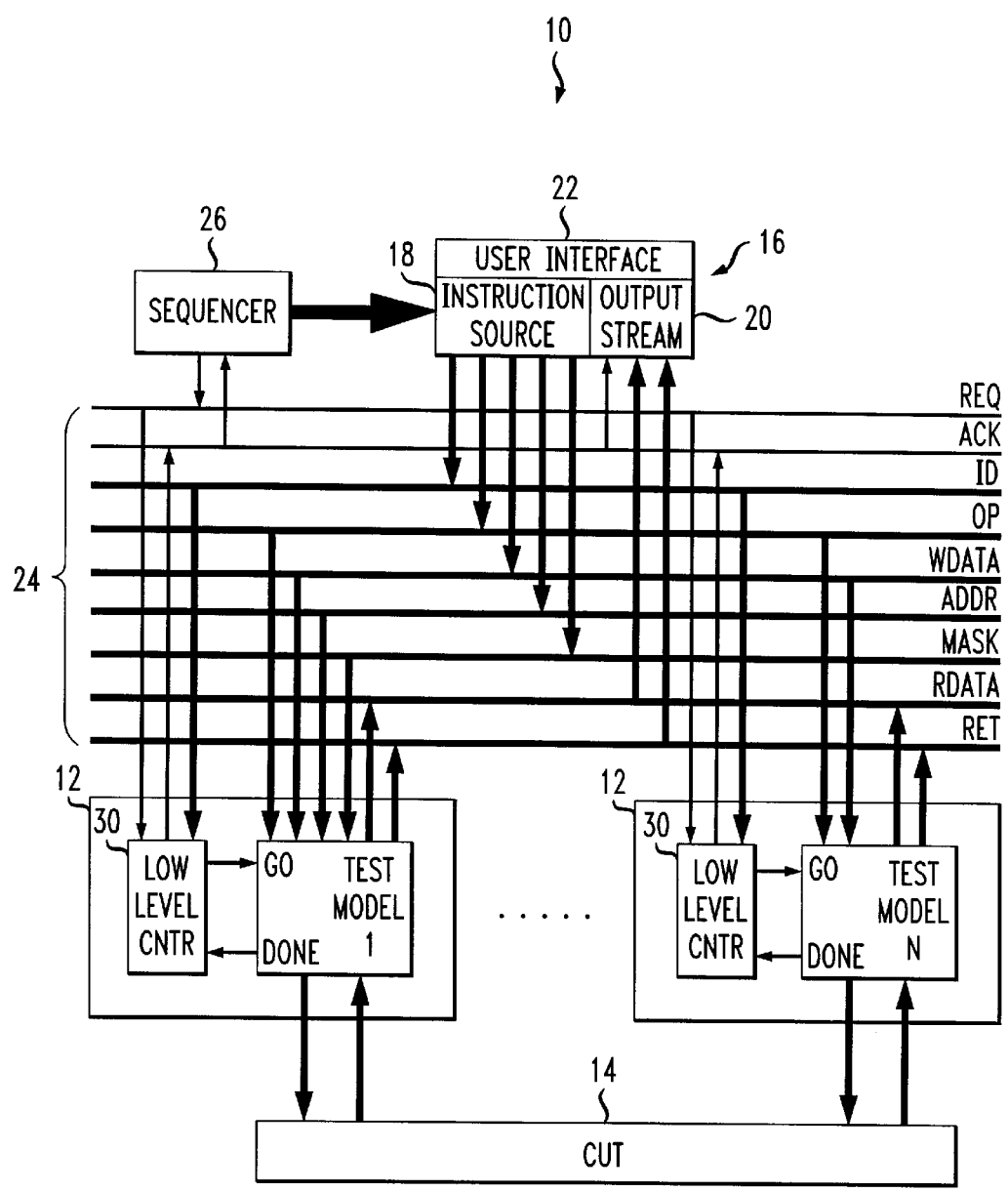
FIG. 4 is a diagrammatic illustration of the simulation testbench shown in FIG. 3 further detailing the operation of the simulation testbench and in particular a model control bus in accordance with aspects of the present invention.

More specifically, with reference to FIG. 4 and continuing reference to FIG. 3, the model control bus 24 is a multi-channel bus. In the illustrated example, it includes 9 channels or lines carrying signals and/or data nominally label as follows: request (REQ), acknowledge (ACK), identification (ID), operation (OP), write data (WDATA), address (ADDR), mask (MASK), return data (RDATA), and return (RET). Optionally, more or less channels are employed.

REQ is a signal initiated by the sequencer 26 which is routed over the model control bus 24 to all the test models 12 indicating that a command is currently in progress. The REQ signal is received in a low level model control 30 incorporated in each test model 12. In particular, the low level model control 30 is part of the common bus interface 28. In any event, the low level model control 30 asserts a go (GO) signal to initiate operation of its host test model 12. The low level model control 30 also receives a done (DONE) signal when the host test model 12 has completed its operation. ACK is a three-state signal sent out over the model control bus 24 which is driven by the low level control 30 of a host test model 12 in response to receipt of a DONE signal.

ID is preferably an 8-bit field associated with each command from the instruction source 18 which is put out on the model control bus 24 with the command. It is used to identify or otherwise address the particular test model 12 for which the command on the model control bus 24 is intended or destined. In this regard then, the command is routed to the test model 12 designated with or otherwise assigned a unique model address which corresponds to the address called for by the ID.

The OP channel conveys an operation code associated with each command. The operation code indicates the operation to be carried out by the test model 12 to which the command is routed. Preferably, the code is 8-bits long for a total of 256 possible codes (e.g., read, write, and other standard or custom driver and/or monitor operations as are known in the art).

WDATA, ADDR, and MASK are all, preferably 32-bit, data fields associated with each command. They are routed along the model control bus 24 along with their associated commands. They include the data used in the various operations being performed by the test models 12. While the names suggest possible uses or applications, they may be employed as a user sees fit. Similarly, RDATA is a three-state, preferably 32-bit, channel for returning results and/or responses from the test models 12 to the output stream 20 of the controller 16. The last channel, RET, is a three-state channel, preferably 8-bits, which carries return codes from the test models 12 to the output stream 20 indicating test model conditions (e.g., it may indicate a time out, successful operation, or other such condition involving the returned data on RDATA).

Optionally, as illustrated in the Nth test model 12, links to the model control bus 24 are not established for those channels not employed by the test model 12. In the illustrated example, the Nth test model 12 is not linked to ADDR or MASK. Generally, links are only established to those channels which the test model 12 may potentially employ.

Figure 5:
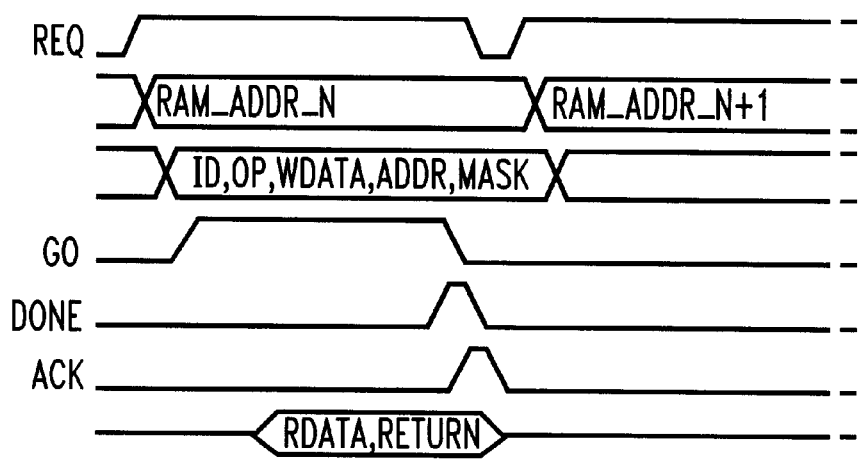
FIG. 5 is a pulse diagram illustrating an operational sequence of the simulation testbench in accordance with aspects of the present invention; and, FIG. 6 is a flow chart showing a method of controlling a simulation testbench in accordance with aspects of the present invention.

In any event, with reference to FIG. 5 and continuing reference to FIGS. 3 and 4, an exemplary control flow is illustrated by way of a pulse diagram. For our purposes here, we shall consider the case where the instruction source 18 is loaded from a RAM module containing a list of commands which are addressed by a RAM address RAM_ADDR_N where N indicates the commands sequence in the list. However, the other techniques, previously detailed above, of loading commands into the instruction source 16 are equally applicable.

The control flow starts with the sequencer 26 asserting REQ (i.e., driving the REQ line high), and incrementing RAM_ADDR_N to select the next command from the instruction source 18 which is put out on the module control bus 24. The command put out on the model control bus 24 includes the associated ID, OP, WDATA, ADDR, and/or MASK. One of the low level model controls 30 detects its ID on the model control bus 24 and asserts GO to its host test model 12. The host test model 12 then initiates an operation in accordance with the operation code on OP using, when the operation so requires, the data in one or more of the data fields on WDATA, ADDR, and/or MASK. Of course, for the operations where no data is needed, e.g., setting of parity or flags, the data fields WDATA, ADDR, and/or MASK are not employed.

When ready, the test model 12 drives the RDATA channel in accordance with data being returned to the output stream 20 and the RET channel in accordance with return codes indicative of the state of the returned data and/or the condition of the test model 12 upon its return. At the same time or some time later, when the host test model 12 has completed its operation, it asserts DONE to the low level control 30 which in turn turns on ACK and turns off GO. The test model 12 sees GO go away and in response thereto turns off DONE.

Upon seeing an active ACK, the controller 16 latches or samples RDATA and/or RET into the output stream 20. At the same time, the sequencer 26 sees ACK asserted and in response thereto turns off REQ. REQ going off turns ACK off, which in turn turns REQ back on, which starts the whole control flow sequence over again.

In this manner then, the simulation is controlled based on where in the sequence a user wants to run a specific test relative to other tests in the sequence, and not based on a specific time in the simulation, e.g., simulation time=1,000,000 ns. That is to say, the next test starts when the previous one finishes. Moreover, individual tests may be started interactively at any desired time.

This architecture also allows the test models 12 to be accessed in zero simulation time. That is to say, the test models 12 are optionally evaluated, modified, analyzed or otherwise accessed via the user interface 22 between successive control flow sequences without affecting the CUT 14 and/or without the CUT 14 experiencing a simulation time lapse (i.e., a clock for the CUT 14 does not advance). In this regard, for example, cycles or loops, termed deltas, of evaluating and inputting new signals to the test model 12 are used to bring about a steady state in which values are no longer changing for the test model 12 thereby initializing the same for a following control flow sequence.

Figure 6:
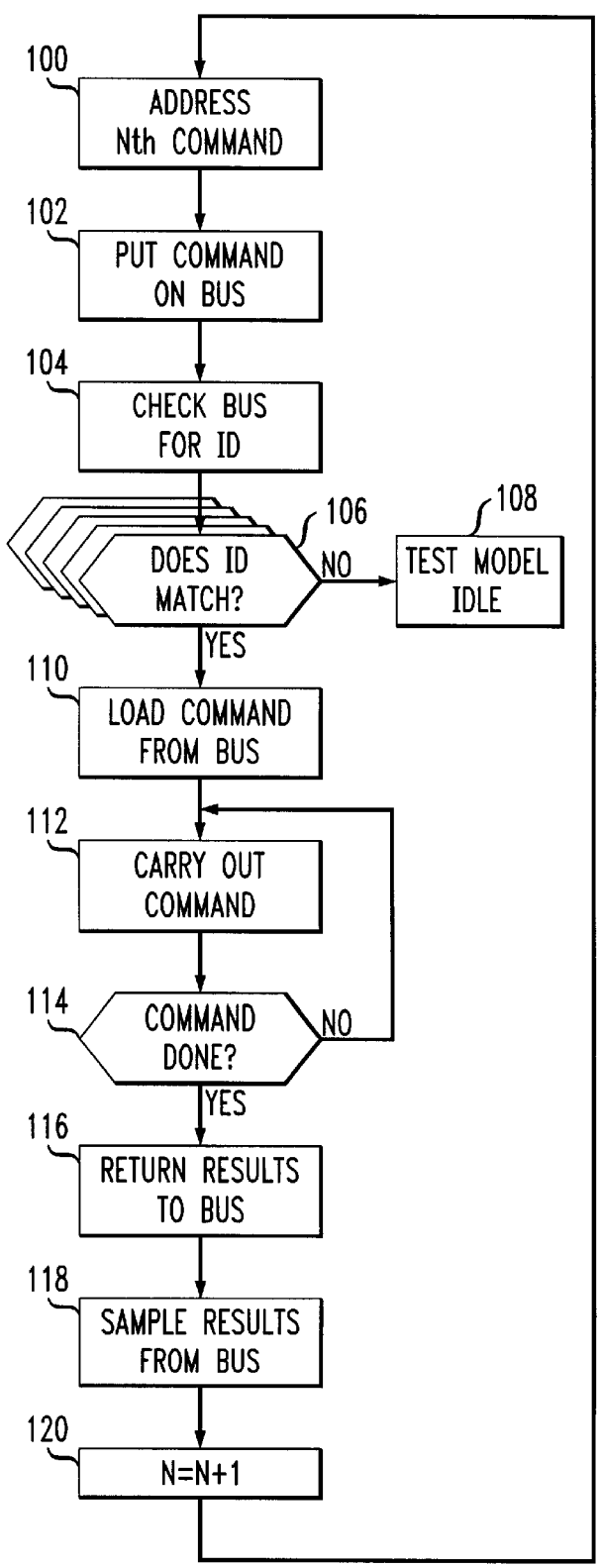

With reference to FIG. 6 and continuing reference to FIGS. 1 through 5, the method of controlling the simulation testbench 10 in accordance with aspects of the present invention is described by way of a flow chart. At step 100, the sequencer 26 addresses the Nth command from the instruction source 18, and in turn, at step 102, the Nth command is put out on the model control bus 24. At step 104, all the test models 12 on the model control bus 24 check the model control bus 24 for their corresponding ID.

Next, at decision step 106, it is determined simultaneously if the ID broadcast on the model control bus 24 matches that of a test model 12. For the test models 12 that do not match, at step 108, those tests models 12 remain idle for the duration of the command and/or current flow cycle and they again check the model control bus 24 for their corresponding ID on subsequent flow cycles in which they may be called upon to perform a command. On the other hand, where there is a match, at step 110, the command is loaded from the model control bus 24 to the test model 12 with the matching ID. Then, at step 112, the test model 12 proceeds to carry out the command in accordance with OP. When, at step 112, carrying out the command does not involve the test model 12 stimulating or otherwise interacting with the CUT 14, then the command and its associated cycle illustrated in FIG. 6 is carried out in zero simulation time. Such commands are, for example, those commands which initialize, modify, analyze, and/or otherwise manipulate the test model 12.

In any event, at determination step 114, it is determined if the test model 12 is done carrying out the command. If it is not done, the flow is looped back to step 112 where the test model 12 continues to carry out the command. On the other hand, if it is done, then at step 116, any results and/or responses from the test model 12 are put back on the model control bus 24. Thereafter, at step 118, the results and/or responses on the model control bus 24 are sampled into the output stream 20. At step 120, the index N is advanced one and the flow continues on to step 100 where the next Nth command is addressed by the sequencer 26.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A simulation testbench comprising:
    a circuit under test;
    a plurality of test models including at least one of a driver which selectively applies stimuli to the circuit under test, and a monitor which observes responses to the stimuli from the circuit under test;
    a controller for the plurality of test models, said controller having an instruction source including a list of commands which control the plurality of test models;
    a model control bus over which the commands are routed to the plurality of test models from the instruction source;
    bus interfaces associated with each of the plurality of test models, each of said bus interfaces linking its associated test model to the model control bus, wherein each bus interface includes a test model control which signals its associated test model to begin an operation in accordance with an accepted command, and receives signals indicative of its associated test model completing the operation; and,
    a sequencer which addresses one command at a time from the list such that it is put out on the model control bus.

2. The simulation testbench according to claim 1, wherein the controller receives responses from the plurality of test models via the model control bus.

3. The simulation testbench according to claim 1, wherein each bus interface accepts commands addressed to its associated test model off of the model control bus, and returns to the controller, via the model control bus, responses to the commands.

4. The simulated testbench according to claim 1, wherein the sequencer has a presence on the model control bus.

5. The simulated testbench according to claim 4, wherein at least one separate channel on the model control bus links the sequencer with the plurality of test models.

6. A simulation testbench comprising:
    a circuit under test;
    a plurality of test models including at least one of a driver which selectively applies stimuli to the circuit under test, and a monitor which observes responses to the stimuli from the circuit under test;
    a controller for the plurality of test models, said controller having an instruction source including a list of commands which control the plurality of test models;
    a model control bus over which the commands are routed to the plurality of test models from the instruction source, wherein each command includes:
        an operator designating an operation to be performed; and,
            a call address corresponding to a unique model address assigned to each test model, said call address designating the test model to which the command is to be routed; and,
    bus interfaces associated with each of the plurality of test models, each of said bus interfaces linking its associated test model to the model control bus, wherein each bus interface includes a test model control which signals its associated test model to begin an operation in accordance with an accepted command, and receives signals indicative of its associated test model completing the operation.

7. The simulation testbench according to claim 6, wherein each command further includes at least one data field which stores data employed in the operation.

8. The simulation testbench according to claim 7, wherein the model control bus includes separate channels for at least each one of the operator, the data field, and the call address.

9. The simulated testbench according to claim 8, wherein the model control bus further includes separate return channels for routing responses from the plurality of test models to the controller.

* * * * *